United States Patent
Ichihara et al.

(10) Patent No.: US 7,434,136 B2
(45) Date of Patent: Oct. 7, 2008

(54) METHOD OF AND APPARATUS FOR READING RECORDING MEDIUM, HARDDISK CONTROLLER

(75) Inventors: Kazuhito Ichihara, Kawasaki (JP); Takao Sugawara, Kawasaki (JP); Akihiro Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 606 days.

(21) Appl. No.: 10/766,969

(22) Filed: Jan. 28, 2004

(65) Prior Publication Data
US 2004/0187066 A1 Sep. 23, 2004

(30) Foreign Application Priority Data
Feb. 18, 2003 (JP) .............................. 2003-039597

(51) Int. Cl.
*H03M 13/00* (2006.01)

(52) U.S. Cl. ................. 714/755; 714/758; 714/770; 714/794; 714/795; 375/341; 375/269

(58) Field of Classification Search ............. 714/755, 714/758, 763, 746, 786, 794, 795, 784; 360/25, 360/65; 375/341, 262
See application file for complete search history.

(56) References Cited

U.S. PATENT DOCUMENTS

| | | | | |
|---|---|---|---|---|
| 6,144,324 A | | 11/2000 | Sasaki | 341/94 |
| 6,400,523 B1 | * | 6/2002 | Katayama et al. | 360/77.04 |
| 6,681,363 B1 | * | 1/2004 | Ikeda et al. | 714/758 |
| 6,694,477 B1 | * | 2/2004 | Lee | 714/784 |
| 7,031,090 B2 | * | 4/2006 | Ichihara et al. | 360/65 |
| 7,055,081 B2 | * | 5/2006 | Boyer et al. | 714/764 |
| 2003/0043487 A1 | * | 3/2003 | Morita et al. | 360/25 |

FOREIGN PATENT DOCUMENTS

| | | |
|---|---|---|
| JP | 10-256921 | 9/1998 |
| JP | 2000-196469 | 7/2000 |
| JP | 2002-171175 | 4/2002 |
| JP | 2002-367291 | 12/2002 |
| WO | WO 97/11544 | 3/1997 |

OTHER PUBLICATIONS

T. Souvignier et al.; "Turbo Decoding for Partial Response Channels"; *IEEE Transactions on Communications*;, vol. 48, No. 8; Aug. 2000; pp. 1297-1308.
Z. Wu; "Coding and Iterative Detection for Magnetic Recording Channels"; *The Kluwer Int'l. Series in Engineering and Computer Sciences*; 2000; pp. 21-67.
K. Ichihara et al.; "A Study of Iterative Decoding with Noise Prediction"; *Technical Report of IEICE*; Dec. 2001; pp. 8-15.

* cited by examiner

*Primary Examiner*—Jacques Louis-Jacques
*Assistant Examiner*—Fritz Alphonse
(74) *Attorney, Agent, or Firm*—Greer, Burns & Crain, Ltd.

(57) ABSTRACT

An ECC determining unit determines whether an error detected by using an ECC has been corrected. When the detected error has not been corrected, an equalizer output sequence transfer unit transfers an equalizer output sequence $y_k$ stored in an equalizer output sequence storage unit to a transfer data storage unit in a hard disk controller, so that a high-performance decoding unit (software) performs repetitive decoding, using the transferred equalizer output sequence $y_k$.

19 Claims, 8 Drawing Sheets

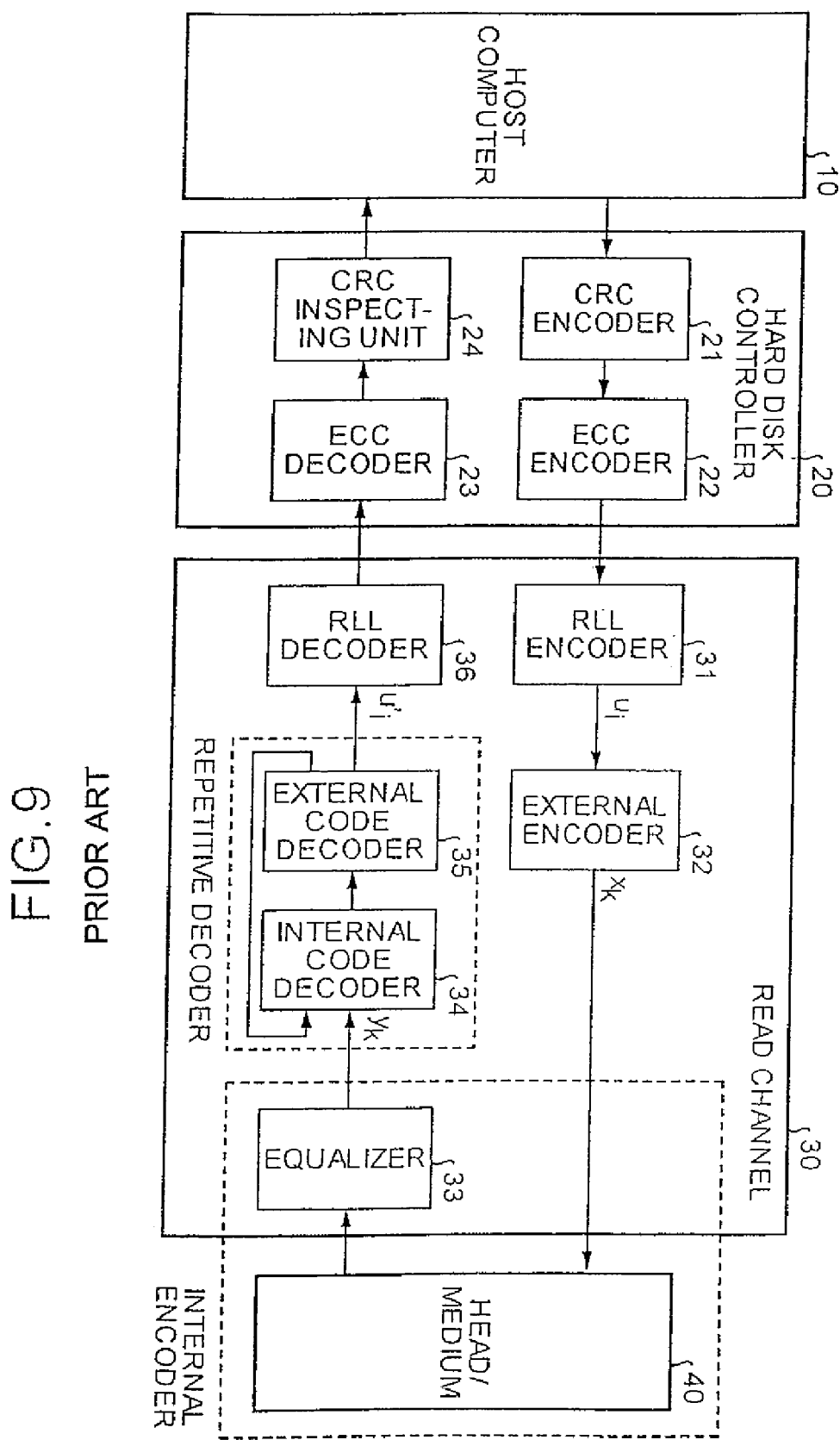

METHOD OF AND APPARATUS FOR READING RECORDING MEDIUM, HARDDISK CONTROLLER

BACKGROUND OF THE INVENTION

1) Field of the Invention

The present invention relates to a technology to reproduce information by performing an error correction decoding of a signal sequence read from a recording medium on which error-correcting-coded information is recorded, with improved decoding performance, without increasing a power consumption and data readout delay.

2) Description of the Related Art

Recently, a repetitive decoding method having high decoding performance is getting an attention as a decoding method for a magnetic recording/reading apparatus, as compared with a conventional Viterbi decoding method (see, for example, "Turbo decoding for partial response channels, T. Souvignier, M. Oberg, P. Siegel, R. Swanson, and J. Wolf, IEEE Transactions Communications, August 2000, Vol.48, No.8, pp. 1297-1308", "Coding and iterative detection for magnetic recording channels, Z. Wu, Kluwer Academic Publishers, 2000", and "A study of iterative decoding with noise prediction, Ichihara, Sugawara, Satoh, and Morita, IEICE, Technical Report, MR2001-85, December 2001, pp. 9-14"). FIG. 9 is a block diagram of a conventional repetitive-decoding-type magnetic recording/reading apparatus.

As shown in the figure, user data consisting of a binary pattern of [0, 1] transmitted from a host computer 10 is input to a hard disk controller 20, and encoded by a cyclic redundancy check codes (CRC) encoder 21 for error mis-correction detection and an error correcting code (ECC) encoder 22 for error correction.

The code sequence encoded by the ECC encoder 22 is input to a read channel 30, encoded by a run length limited (RLL) encoder 31 so as to enable timing correction at the time of reproduction in a phase locked loop (PLL), and an RLL code sequence $u_i$ (i=1 to m) obtained by encoding is input to an external encoder 32.

The RLL code sequence $u_i$ input to the external encoder 32 is encoded into a recording sequence $x_k$ (k=1 to n), and the recording sequence $x_k$ is magnetically recorded and reproduced via a head/medium 40, and shaped to a desired waveform by an equalizer 33. The external encoder 32 performs encoding by using a turbo code or a low density parity check (LDPC) code, which enable repetitive decoding using reliability information (probability information whether any bit is "0" or "1").

A magnetic recording/reading channel comprising the head/medium 40 and the equalizer 33 can be regarded as an encoder, which converts the external encoder output into an output of the magnetic recording/reading channel, and is referred to as an internal encoder.

The reliability information $\Lambda(x_k)$ with respect to the recording sequence $x_k$ is calculated by an internal code decoder 34 corresponding to the internal encoder, from an equalizer output sequence $y_k$ (k=1 to n) output from the equalizer 33, and external information $\Lambda_e(x_k)=\Lambda(x_k)-\Lambda_a(x_k)$ is calculated from the reliability information $\Lambda(x_k)$ and the prior information $\Lambda_a(x_k)$ obtained prior to decoding.

The calculated external information $\Lambda_e(x_k)$ is input to an external code decoder 35 as the prior information $\Lambda_a(u'_i)$ with respect to a maximum a posteriori decoding sequence $u'_i$, to calculate the reliability information $\Lambda(u'_i)$ with respect to the maximum a posteriori decoding sequence $u'_i$. It is then checked whether the reliability information $\Lambda(u'_i)$ calculated by the external code decoder 35 satisfies a predetermined iteration termination condition.

As a result, when the predetermined iteration termination condition is not satisfied, the external information $\Lambda_e(u'_i)$ with respect to the maximum a posteriori decoding sequence $u'_i$ is calculated, and the prior information $\Lambda_a(x_k)$ with respect to the recording sequence $x_k$ is calculated from the external information $\Lambda_e(u'_i)$, and returned to the internal code decoder 34.

Calculation of the reliability information $\Lambda(x_k)$ by the internal code decoder 34 and calculation of the reliability information $\Lambda(u'_i)$ by the external code decoder 35 are then repeated. When the predetermined iteration termination condition is satisfied, binary decision, whether "0" or "1", is performed with respect to the reliability information $\Lambda(u'_i)$ is performed, and the maximum a posteriori decoding sequence $u'_i$ is output by the external code decoder 35.

In this manner, high-performance decoding is performed by using the internal code decoder 34 and the external code decoder 35 to repetitively calculate the reliability information $\Lambda(x_k)$ and the reliability information $\Lambda(u'_i)$ in the repetitive decoding method.

The maximum a posteriori decoding sequence $u'_i$ output by the external code decoder 35 is transmitted to an RLL decoder 36 to be RLL-decoded, and an RLL decoding sequence output by the RLL decoder 36 is subjected to error correction by an ECC decoder 23, and further subjected to error correction check by a CRC detector 24, and reproduced as user data.

However, since it is necessary to repetitively calculate data for one sector (e.g. 512 bytes) by using a plurality of internal and external code decoders 34 and 35, in order to perform high-performance decoding, the repetitive decoding has such problems that the hardware quantity increases, and the power consumption and data readout delay also increase.

On the other hand, when the repetition number is decreased to reduce the power consumption and data readout delay, the decoding performance deteriorates, and it becomes necessary to make the length of a check bit of the ECC longer in order to supplement the performance deterioration. As a result, a recording area for a data bit decreases, and the data recording density decreases.

SUMMARY OF THE INVENTION

It is an object of the present invention to solve at least the problems in the conventional technology.

The apparatus for reading a recording medium, according to one aspect of the present invention includes a determining unit that determines whether an error detected by using an error correcting code is correctable with respect to a signal sequence read from the recording medium, and a decoding unit that performs maximum a posteriori decoding of the signal sequence upon the determining unit determining that the error is not correctable.

The method for reading a recording, according to another aspect of the present invention includes determining whether an error detected by using an error correcting code is correctable, and performing maximum a posteriori decoding of a signal sequence read from the recording medium upon determining that the error is not correctable.

The hard disk controller used in an apparatus for reading a recording medium, according to still another aspect of the present invention includes a determining unit that determines whether an error detected by using an error correcting code is correctable with respect to a signal sequence read from the recording medium, a decoding unit that performs maximum a posteriori decoding of the signal sequence, upon the determining unit determining that the error is not correctable, a correcting unit that detects an error by using the error correcting code with respect to the signal sequence, and corrects the detected error, and a checking unit that checks whether the error correction by the correcting unit is correct.

The other objects, features and advantages of the present invention are specifically set forth in or will become apparent from the following detailed descriptions of the invention when read in conjunction with the accompanying drawings.

BRIEF DESCRIPTION OF THE DRAWING

FIG. 9 is a block diagram of a conventional repetitive-decoding-type magnetic recording/reading apparatus.

DETAILED DESCRIPTION

Exemplary embodiments of a method of and an apparatus for reading a recording medium and a hard disk controller according to the present invention are explained below in detail, with reference to the accompanying drawings. An example in which an LDPC code is used for encoding by the external encoder 32 is explained in a first embodiment of the present invention, and an example of using Viterbi decoding that does not require the external encoder 32 is explained in a second embodiment of the present invention.

Figure 1:
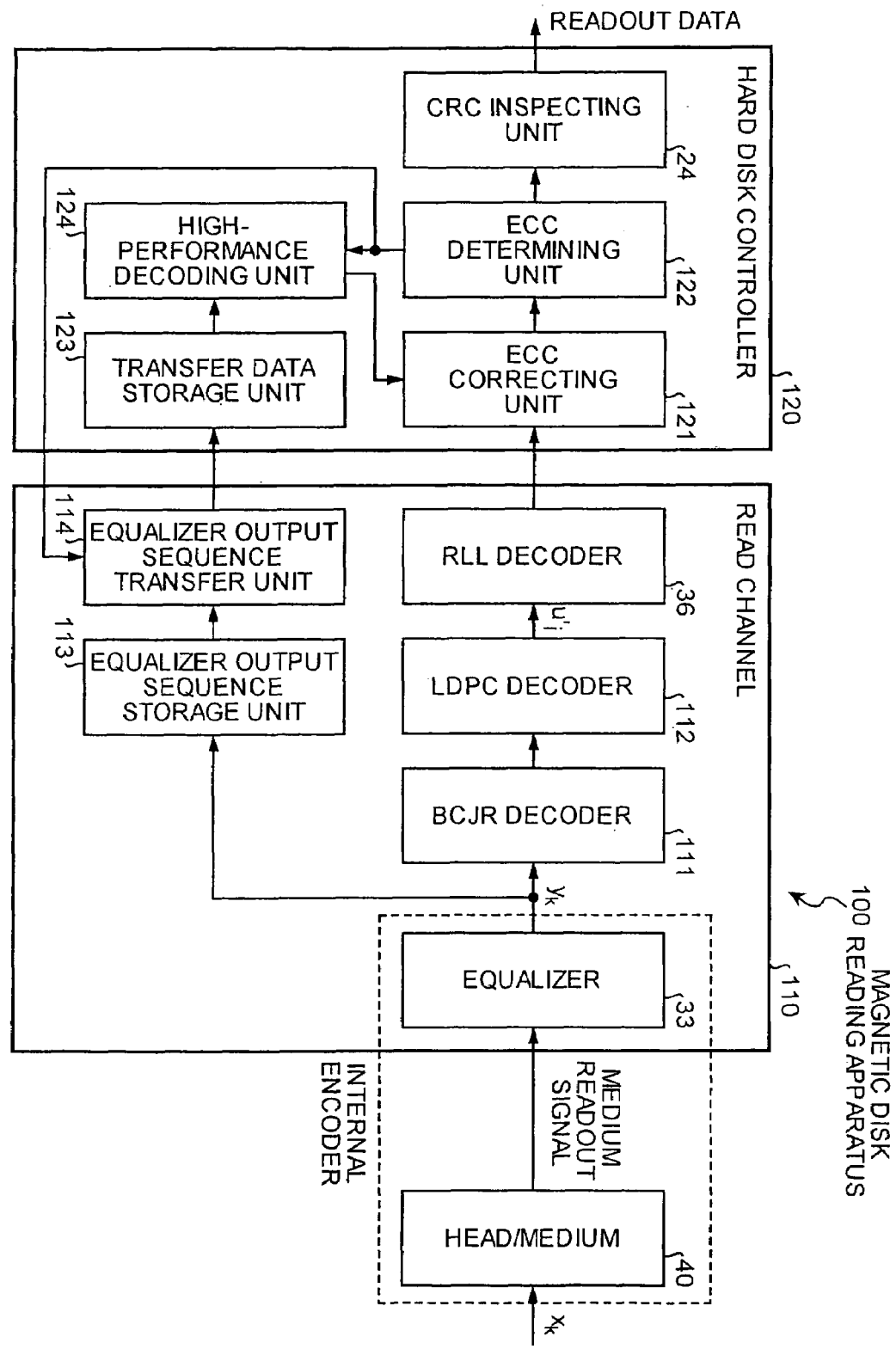
FIG. 1 is a block diagram of a magnetic disk reading apparatus according to a first embodiment of the present invention.

FIG. 1 is a functional block diagram of a magnetic disk reading apparatus according to the first embodiment. This magnetic disk reading apparatus 100 has a head/medium 40, a read channel 110, and a hard disk controller 120.

The head/medium 40 is a medium that stores a recording sequence $x_k$ and a head for taking out the recording sequence $x_k$ recorded in the medium as a medium readout signal. The medium readout signal output by the head/medium 40 becomes an input signal to the read channel 110.

The read channel 110 is a channel for decoding a signal read out from the medium, and comprises an equalizer 33, a BCJR (Bahl, Cocke, Jelinken, and Raviv) decoder 111, an LDPC decoder 112, an RLL decoder 36, an equalizer output sequence storage unit 113, and an equalizer output sequence transfer unit 114.

The equalizer 33 is a processing unit that shapes a medium readout signal output from the head/medium 40 to output an equalizer output sequence $y_k$, and has a continuous time filter (CTF) that suppresses noise by limiting the frequency, and a finite impulse response (FIR) filter that finally shapes the waveform of the CTF output by a finite delay line and taps.

The BCJR decoder 111 is an internal code decoder that performs maximum a posteriori decoding based on the BCJR decoding procedure, and specifically, calculates the reliability information $\Lambda(x_k)$ and the external information $\Lambda_e(x_k)$, by using the equalizer output sequence $y_k$ and the prior information $\Lambda_a(x_k)$.

The LDPC decoder 112 is an external code decoder that calculates the reliability information $\Lambda(u'_i)$ with respect to the maximum a posteriori decoding sequence $u'_i$, by using the external information $\Lambda_e(x_k)$ output by the BCJR decoder 111, and outputs the maximum a posteriori decoding sequence $u'_i$ from the calculated reliability information $\Lambda(u'_i)$.

In this manner, the hardware quantity in the read channel 110 can be reduced, and the power consumption and the data readout delay in the read channel 110 can be also reduced, by performing maximum a posteriori decoding by using only one BCJR decoder 111 and one LDPC decoder 112.

The RLL decoder 36 is a decoder that RLL-decodes the maximum a posteriori decoding sequence $u'_i$ output by the LDPC decoder 112, and outputs the decoded RLL decoding sequence to the hard disk controller 120.

The equalizer output sequence storage unit 113 is a storage unit that stores the equalizer output sequence $y_k$ output from the equalizer 33, and the equalizer output sequence $y_k$ stored in the equalizer output sequence storage unit 113 is used by the hard disk controller 120.

The equalizer output sequence transfer unit 114 is a processing unit that transfers the equalizer output sequence $y_k$ for one sector (e.g. 512 bytes) stored in the equalizer output sequence storage unit 113 to the hard disk controller 120, according to the instruction of the hard disk controller 120. The equalizer output sequence transfer unit 114 transfers the equalizer output sequence $y_k$ for one sector at a high speed via a non return to zero (NRZ) bus.

The hard disk controller 120 is a controller that receives the RLL decoding sequence from the read channel 110, and performs error correction in the received RLL decoding sequence to output the corrected RLL decoding sequence to a host computer, and comprises an ECC correction unit 121, an ECC determining unit 122, a CRC inspecting unit 24, a transfer data storage unit 123, and a high-performance decoding unit 124. The ECC determining unit 122 constitutes an error correctability determining unit in the present invention, and the high-performance decoding unit 124 constitutes a decoding unit in the present invention.

The ECC correction unit 121 is a processing unit that receives the RLL decoding sequence from the read channel 110, and detects an ECC error in the received RLL decoding sequence to correct the error. The ECC correction unit 121 also receives the RLL decoding sequence from the high-performance decoding unit 124, and detects an ECC error for correction.

The ECC determining unit 122 is a processing unit that determines whether an ECC error has been detected, and when the ECC error is detected, determines whether the detected ECC error has been corrected. In other words, when the ECC error has not been detected, or when the detected ECC error has been corrected, since sufficient decoding performance has been obtained by the maximum a posteriori decoding by the read channel 110, the ECC determining unit 122 transmits the ECC decoding result to the CRC inspecting unit 24.

On the other hand, when the ECC error is detected but the detected ECC error has not been corrected, since the performance by the maximum a posteriori decoding by the read channel 110 is not sufficient and high-performance maximum a posteriori decoding is required, the ECC determining unit 122 requests transfer of the equalizer output sequence $y_k$ with respect to the equalizer output sequence transfer unit 114 in the read channel 110, and instructs the high-performance decoding unit high-performance decoding unit 124 to perform high-performance maximum a posteriori decoding for the equalizer output sequence $y_k$.

When the ECC determining unit 122 determines whether the detected ECC error has been corrected, and when the detected ECC error has not been corrected, the high-performance decoding unit 124 performs higher performance maximum a posteriori decoding. As a result, the maximum a posteriori decoding by the read channel 110 can be made simple.

The CRC inspecting unit 24 is a processing unit that inputs the ECC decoding sequence generated by the ECC correction unit 121 and detects error correction by the ECC correction unit 121 to perform CRC decoding, and transmits the decoded result to the host computer as readout data.

The transfer data storage unit 123 is a storage unit that stores the equalizer output sequence $y_k$ transferred by the equalizer output sequence transfer unit 114, and the equalizer output sequence $y_k$ stored in the transfer data storage unit 123 is used by the high-performance decoding unit 124.

The high-performance decoding unit 124 is a processing unit that performs high-performance decoding for the equalizer output sequence $y_k$ based on the instruction of the ECC determining unit 122. Specifically, the high-performance decoding unit 124 performs high-performance maximum a posteriori decoding by using repetitive decoding, and transmits the decoding result to the ECC correction unit 121.

The high-performance decoding unit 124 has considerably high decoding performance, as compared with that of the BCJR decoder 111 and the LDPC decoder 112 in the read channel 110. Therefore, the ECC correction unit 121 can correct the error in the decoding sequence decoded by the high-performance decoding unit 124, even if it cannot correct an error in the decoding sequence decoded by the read channel 110. Further, the high-performance decoding unit 124 does not require ECC error correction itself, and hence can eliminate a redundant bit required for error correction.

Thus, since the high-performance decoding unit 124 performs high-performance repetitive decoding, the maximum a posteriori decoding processing for the equalizer output sequence $y_k$ by the read channel 110 can be made simple, thereby reducing the hardware quantity of the read channel 110.

Figure 2:
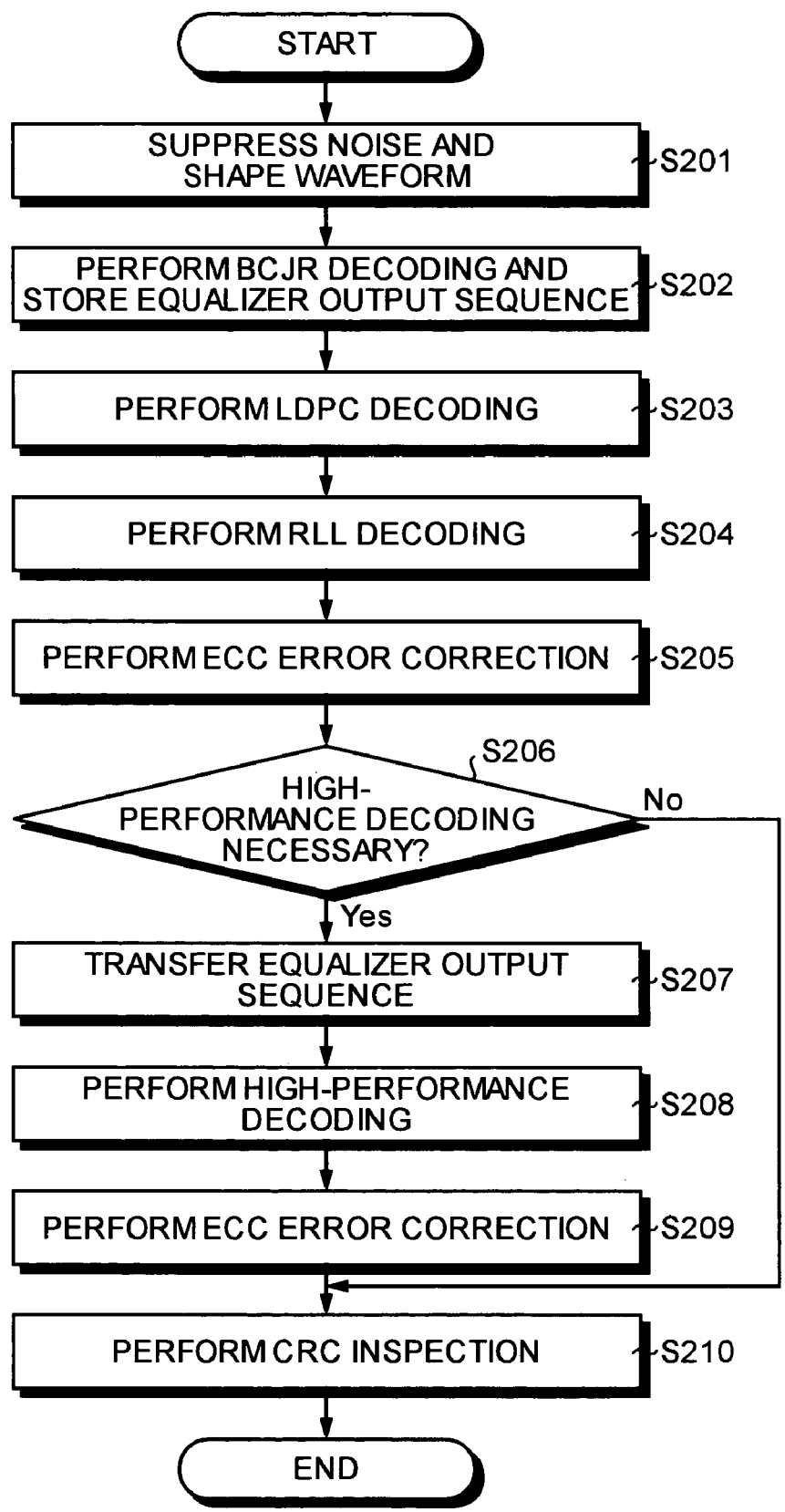
FIG. 2 is a flowchart of reading process in the magnetic disk reading apparatus according to the first embodiment.

FIG. 2 is a flowchart of reading process in the magnetic disk reading apparatus 100 according to the first embodiment. In the magnetic disk reading apparatus 100, the equalizer 33 performs waveform shaping by suppressing noise in a signal read from the medium (step S201). The BCJR decoder 111 inputs the equalizer output sequence $y_k$ output by the equalizer 33 to perform BCJR decoding.

In other words, the BCJR decoder 111 calculates the reliability information $\Lambda(x_k)$ and the external information $\Lambda_e(x_k)$ with respect to the recording sequence $x_k$. At the same time, the equalizer output sequence $y_k$ output by the equalizer 33 is stored in the equalizer output sequence storage unit 113 (step S202).

The LDPC decoder 112 inputs the external information $\Lambda_e(x_k)$ output by the BCJR decoder 111 to perform LDPC decoding (step S203). In other words, the LDPC decoder 112 calculates the reliability information $\Lambda(u'_i)$ with respect to the maximum a posteriori decoding sequence $u'_i$ and outputs the maximum a posteriori decoding sequence $u'_i$.

The RLL decoder 36 RLL-decodes the maximum a posteriori decoding sequence $u'_i$ (step S204), and the ECC correction unit 121 inputs the RLL decoding result to perform error detection and correction based on the ECC (step S205).

The ECC determining unit 122 determines whether the detected error can be corrected, that is, whether the high-performance decoding is required (step S206). As a result, when the high-performance decoding is required, the equalizer output sequence transfer unit 114 transfers the equalizer output sequence $y_k$ stored in the equalizer output sequence storage unit 113 to the transfer data storage unit 123 (step S207).

The high-performance decoding unit 124 performs high-performance maximum a posteriori decoding by using the equalizer output sequence $y_k$ stored in the transfer data storage unit 123 (step S208), and the ECC correction unit 121 performs the ECC error detection and correction again with respect to the decoding result (step S209). Lastly, the CRC inspecting unit 24 inspects the error correction, and transmits the readout data to the host computer 10 (step S210).

On the other hand, when the high-performance decoding is not required, the CRC inspecting unit 24 inspects the error correction (step S209), and transmits the readout data to the host computer 10 (step S210).

The processing procedure of the ECC determining unit 122 shown in FIG. 1 will be explained below. The processing of the ECC determining unit corresponds to the determination processing whether the high-performance decoding in FIG. 2 is required (step S206).

Figure 3:
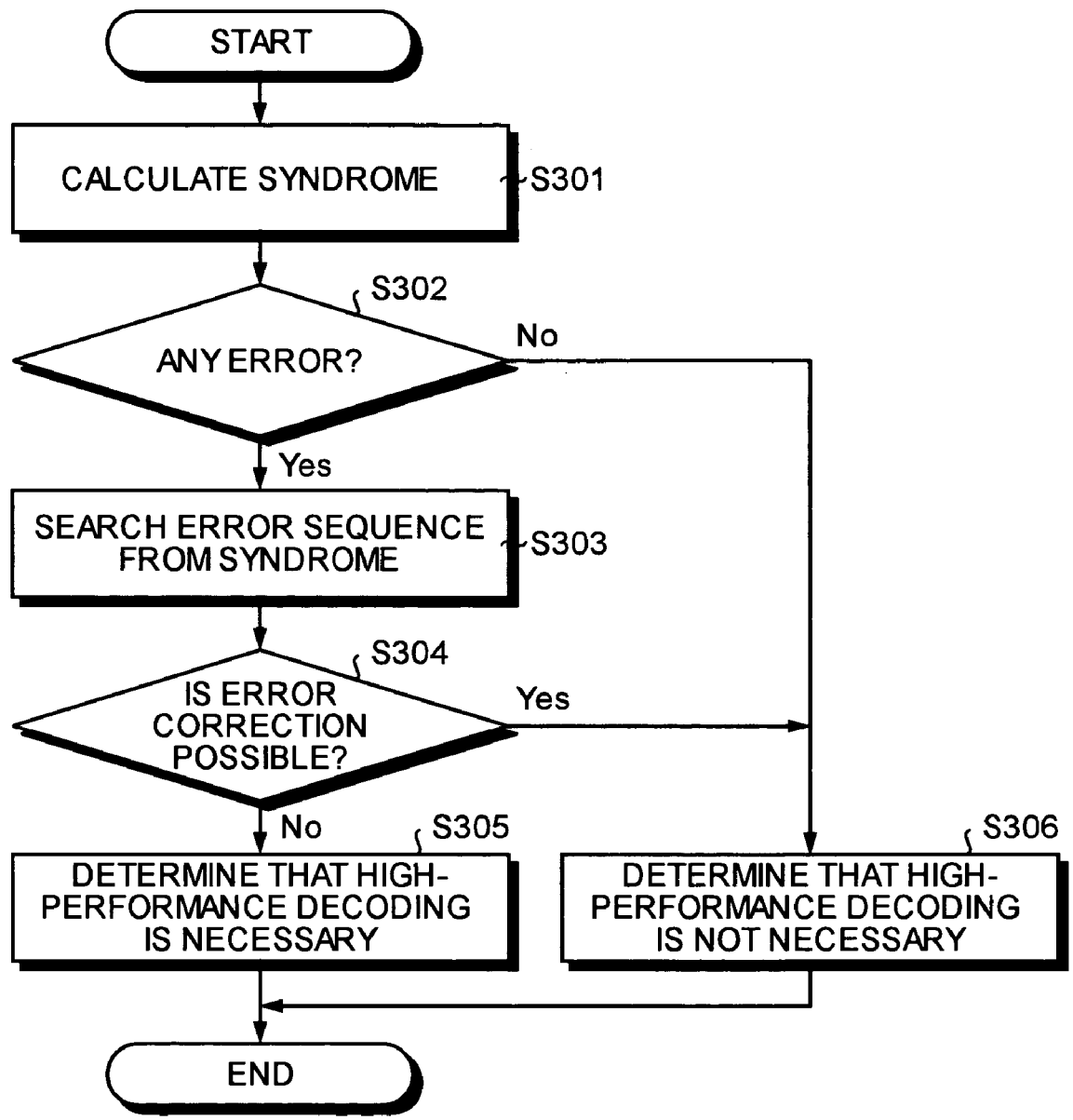
FIG. 3 is a flowchart of determining process in an ECC determining unit shown in FIG. 1.

FIG. 3 is a flowchart of determining process in the ECC determining unit 122 shown in FIG. 1. The ECC determining unit 122 first calculates syndrome s (step S301).

The syndrome $s=(s_1, s_2, \ldots, s_j)$ is a vector in j dimensions calculated by: $s=wH^T=(w_m, w_p)[-P^T I]=w_p-w_m P$, where a portion corresponding to an information bit of an ECC decoded sequence $w=(w_1, w_2, \ldots, w_1)$ is referred to as $w_m$, a portion corresponding to a check bit is referred to as $w_p$, an ECC check matrix is referred to as H, and an ECC check symbol generation matrix is referred to as P Here, I refers to a unit matrix in the j dimensions.

Further, when it is assumed that an ECC sequence is $v=(v_1, v_2, \ldots, v_1)$, and an error sequence is $e=(e_1, e_2, \ldots, e_1)$, the ECC decoded sequence w becomes: $w=v+e$, and $s=wH^T=vH^T+eH^T=eH^T$.

Therefore, the syndrome s is a quantity determined only by the error sequence e, regardless of the ECC sequence v, and the error sequence e can be determined from the syndrome s, by using a correspondence table in which the syndrome s and the error sequence e are made to correspond to each other. When all elements in the syndrome s is "0", it can be determined that there is no error The ECC determining unit 122 checks whether all elements in the calculated syndrome s is "0", that is, whether there is an error (step S302). When there is an error, the correspondence table, in which the syndrome s and the error sequence e are made to correspond to each other and stored, is searched (step S303), to check whether there is an error sequence e, that is, error correction is possible (step S304).

As a result, if there is no error sequence e in the correspondence table, and error correction is not possible, it is determined that the high-performance decoding is necessary (step S305). If there is an error sequence e in the correspondence table, and error correction is possible, it is determined that the high-performance decoding is not required (step S306). On the other hand, if there is no error, it is determined that the high-performance decoding is not necessary.

In this manner, the ECC determining unit 122 calculates the syndrome s, and searches the correspondence table, in which the syndrome s and the error sequence e are made to correspond to each other and stored, to determine whether the ECC error can be corrected, thereby enabling determination whether the high-performance maximum a posteriori decoding is necessary.

The configuration of the high-performance decoding unit 124 shown in FIG. 1 will be explained. The high-performance decoding unit 124 is realized by software executed by a microprocessing unit (MPU). By realizing the high-performance decoding unit 124 by software, an increase in the hardware of the hard disk controller 120 can be prevented.

Figure 4:
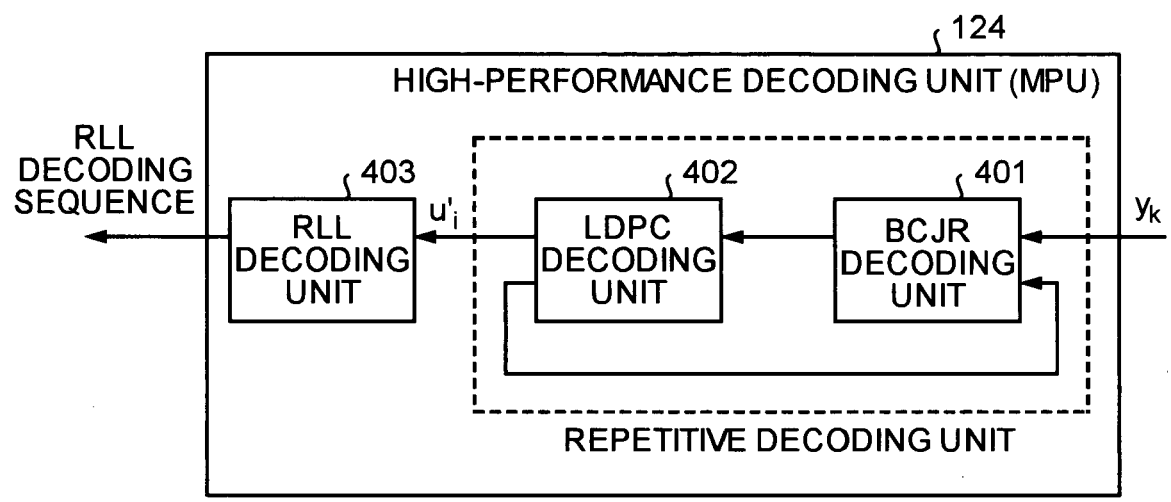
FIG. 4 is a block diagram for illustrating a software configuration of a high-performance decoding unit shown in FIG. 1.

FIG. 4 is a block diagram of the high-performance decoding unit 124 shown in FIG. 1. The high-performance decoding unit 124 has a BCJR decoding unit 401, an LDPC decoding unit 402, and an RLL decoding unit 403.

The BCJR decoding unit 401 is an internal code decoding unit that performs maximum a posteriori decoding based on the BCJR decoding procedure, and specifically, calculates the reliability information $\Lambda(x_k)$ and the external information $\Lambda_e(x_k)$ by using the equalizer output sequence $y_k$ and the prior information $\Lambda_a(x_k)$ stored in the transfer data storage unit 123.

The LDPC decoding unit 402 is an external code decoding unit that calculates the reliability information $\Lambda(u'_i)$ with respect to the maximum a posteriori decoding sequence $u'_i$, by using the external information $\Lambda_e(x_k)$ output from the BCJR decoding unit 401. The LDPC decoding unit 402 checks the iteration termination condition, and when the iteration termination condition is not satisfied, LDPC decoding unit 402 calculates the external information $\Lambda_e(u'_i)$ with respect to the maximum a posteriori decoding sequence $u'_i$, and returns it to the BCJR decoding unit 401.

The BCJR decoding unit 401 having received the external information $\Lambda_e(u'_i)$ calculates the reliability information $\Lambda(x_k)$ and the external information $\Lambda_e(x_k)$ with respect to the recording sequence $x_k$ again, using the external information $\Lambda_e(u'_i)$ as the prior information $\Lambda_e(x_k)$ with respect to the recording sequence $x_k$.

The BCJR decoding unit 401 and the LDPC decoding unit 402 repeat the decoding calculation until the iteration termination condition is satisfied. On the other hand, when the iteration termination condition is satisfied, the LDPC decoding unit 402 binarizes the reliability information $\Lambda(u'_i)$ with respect to the maximum a posteriori decoding sequence $u'_i$, and outputs the maximum a posteriori decoding sequence $u'_i$.

Thus, the high-performance decoding unit 124 can perform high-performance maximum a posteriori decoding by performing repetitive decoding, designating the BCJR decoding unit 401 as the internal code decoding unit and the LDPC decoding unit 402 as the external code decoding unit.

The RLL decoding unit 403 is a processing unit that RLL-decodes the maximum a posteriori decoding sequence $u'_i$ output by the LDPC decoding unit 402 by performing repetitive decoding, and outputs the RLL-decoded RLL decoding sequence to the ECC correction unit 121.

As described above, in the first embodiment, the ECC determining unit 122 determines whether an error detected by using an ECC, for example a Reed-Solomon code, has been corrected, and when the detected error has not be corrected, the high-performance decoding unit 114 performs high-performance maximum a posteriori decoding by repetitive decoding, using the equalizer output sequence $y_k$ stored in the equalizer output sequence storage unit 113. As a result, the number of the BCJR decoding units and the LDPC decoding units in the read channel 110 may be only one, respectively, and hence the hardware quantity of the read channel 110 can be reduced, and the power consumption and the data readout delay can be also reduced.

In the first embodiment, since the high-performance decoding unit 114 performs high-performance maximum a posteriori decoding by repetitive decoding, the check bit to be used in the ECC error correction can be shortened or eliminated, thereby improving the data recording density of the magnetic disk.

In the first embodiment, an example in which the high-performance decoding unit 124 is realized as the software executed by the MPU in the hard disk controller 120 has been explained. However, the present invention is not limited thereto, and the software constituting the high-performance decoding unit 124 can be applied likewise to an instance in which the software constituting the high-performance decoding unit 124 is executed by another MPU.

Figure 5:
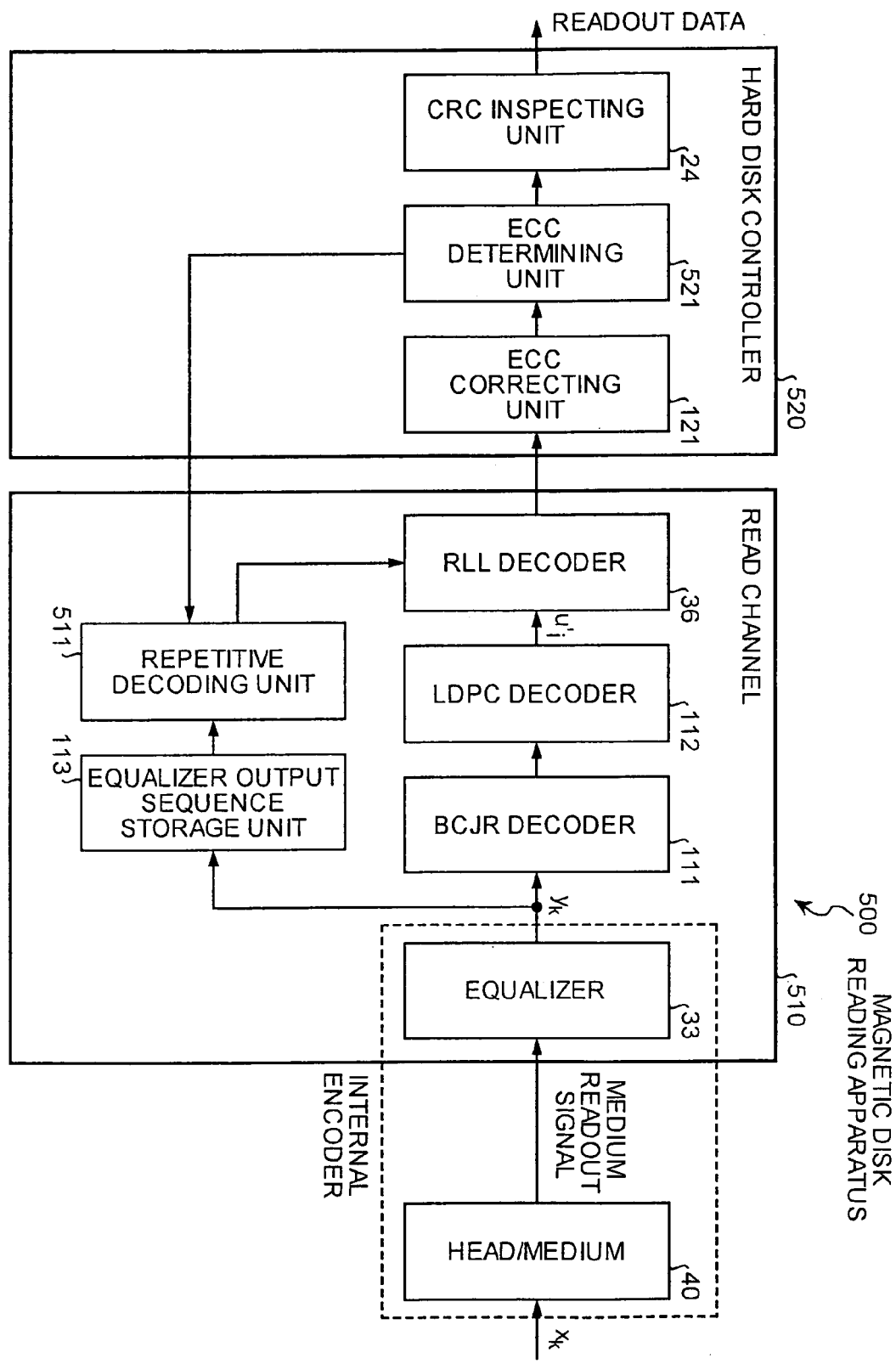
FIG. 5 is a block diagram of a magnetic disk reading apparatus, in which a software for performing a repetitive decoding is executed by a micro processing unit (MPU) provided in a read channel.

For example, an MPU that executes the software for performing repetitive decoding can be provided in a read channel 510. FIG. 5 is a block diagram of a magnetic disk reading apparatus 500, in which a software for performing repetitive decoding is executed by an MPU provided in the read channel 510. For the convenience of explanation, functional units that perform the same roles as those of the respective units shown in FIG. 1 are denoted by like signs, and the detailed explanation thereof is omitted.

The magnetic disk reading apparatus 500 has the head/medium 40, the read channel 510, and a hard disk controller 520. The read channel 510 comprises a repetitive decoding unit 511, in addition to the equalizer 33, the BCJR decoder 111, the LDPC decoder 112, the RLL decoder 36, and the equalizer output sequence storage unit 113.

The repetitive decoding unit 511 is a processing unit that performs high-performance maximum a posteriori decoding by using the equalizer output sequence $y_k$ stored in the equalizer output sequence storage unit 113, upon reception of an instruction from the hard disk controller 520. The repetitive decoding unit 511 is realized by the software executed by the MPU in the read channel 510, and performs repetitive decoding until a predetermined termination condition is satisfied.

Further, the magnetic disk reading apparatus 500 can perform RLL decoding by using the RLL decoder 36 in the read channel 510, and the repetitive decoding unit 511 does not have to perform RLL decoding, different from the high-performance decoding unit 124.

The hard disk controller 520 has the ECC correction unit 121, an ECC determining unit 521, and the CRC inspecting unit 24. The ECC determining unit 521 determines whether an ECC error has been detected, and when the ECC error has been detected, determines whether the detected ECC error has been corrected. When the ECC error is detected but the detected ECC error has not been corrected, the ECC determining unit 521 instructs the repetitive decoding unit 511 in the read channel 510 to re-decode the equalizer output sequence $y_k$.

As described above, in the magnetic disk reading apparatus 500, the repetitive decoding unit 511 is provided in the read channel 510, to perform high-performance repetitive decoding, directly using the equalizer output sequence $y_k$ stored in the equalizer output sequence storage unit 113. Therefore, transfer of the equalizer output sequence $y_k$ from the read channel 510 to the hard disk controller 520 is not necessary, and hence high-performance maximum a posteriori decoding can be performed at a higher speed.

In the first embodiment, an example in which the high-performance decoding unit 124 and the repetitive decoding unit 511 are realized by the software has been explained, but the present invention is not limited thereto, and is also applicable to an instance in which the high-performance decoding unit 124 and the repetitive decoding unit 511 are realized by hardware.

When the high-performance decoding unit 124 and the repetitive decoding unit 511 are realized by the hardware, the power consumption can be suppressed to low, by activating the high-performance decoding unit 124 and the repetitive decoding unit 511, only when the ECC determining units 122 and 521 determine that high-performance maximum a posteriori decoding is necessary.

Further, in the first embodiment, an example in which the BCJR decoding is used for the internal code decoding used for repetitive decoding, and the LDPC decoding is used for the external code decoding has been explained. However, the present invention is not limited thereto, and can be applied likewise to an instance in which another decoding method such as decision aided equalizer (DAE) decoding is used for the internal code decoding, and another decoding method such as turbo decoding is used for the external code decoding.

In the first embodiment, an example in which the maximum a posteriori decoding of the equalizer output sequence $y_k$ is performed by using the BCJR decoder 111 and the LDPC decoder 112 together in the read channels 110 and 510 has been explained. However, the Viterbi decoder can be used for decoding the equalizer output sequence $y_k$ as before. Therefore, in a second embodiment of the present invention, an example in which the Viterbi decoder is used for decoding the equalizer output sequence $y_k$ will be explained.

Figure 6:
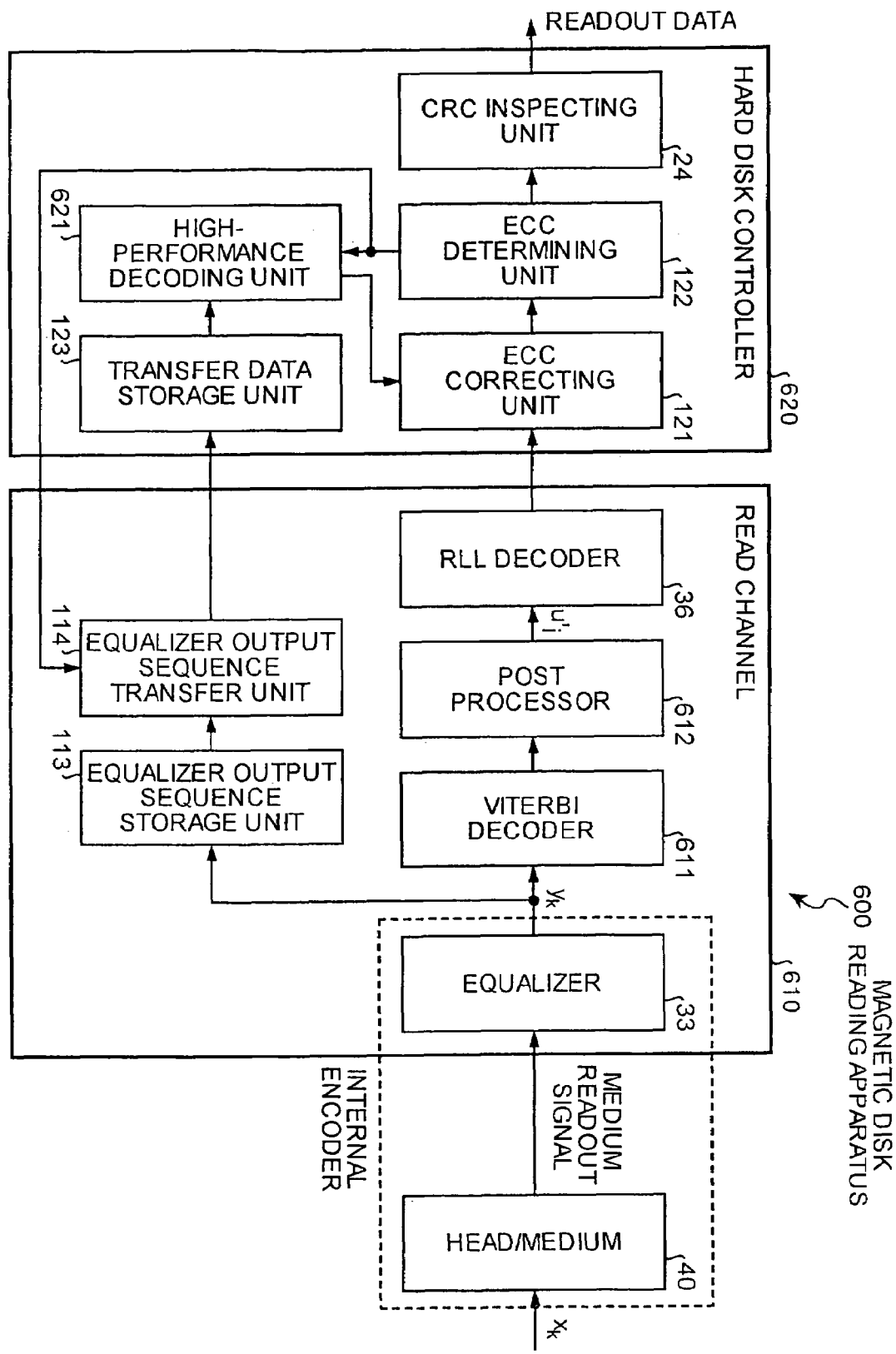
FIG. 6 is a block diagram of a magnetic disk reading apparatus according to a second embodiment of the present invention.

FIG. 6 is a block diagram of the magnetic disk reading apparatus according to the second embodiment. For the convenience of explanation, functional units that perform the same roles as those of the respective units shown in FIG. 1 are denoted by like reference numerals, and the detailed explanation thereof is omitted.

The magnetic disk reading apparatus 600 has the head/medium 40, a read channel 610, and a hard disk controller 620. The read channel 610 comprises a Viterbi decoder 611 and a post processor 612, instead of the BCJR decoder 111 and the LDPC decoder 112 included in the read channel 110.

The Viterbi decoder 611 is a decoder that performs maximum likelihood decoding of the equalizer output sequence $y_k$. However, the Viterbi decoder 611 does not perform external code decoding in the repetitive decoding, and performs only decoding of a convolutional code by a magnetic recording/reading channel comprising the head/medium 40 and the equalizer 33.

Therefore, a recorder that records information on a medium reproduced by the magnetic disk reading apparatus 600 does not perform encoding by the external encoder, but instead, an RLL encoder records a code sequence in which an even-odd parity bit is added to an RLL code on the medium.

The Viterbi decoder 611 calculates channel information $\Lambda_c$ shown in equation (1) from the equalizer output sequence $y_k$ to perform decoding, assuming that the equalizer output sequence $y_k$ is a sequence of ideal integer values ($\ldots, -2, -1, 0, 1, 2, \ldots$), and channel noise is white noise without having any correlation.

$$\Lambda_c(y_k) = -\ln\sigma - \frac{(y_k - d)^2}{2\sigma^2} \quad (1)$$

where $y_k$: equalizer output sequence
   d: ideally equalized value
   $\sigma^2$: noise power value after equalization.

The post processor 612 is a processing unit that detects an error based on the even-odd parity bit in the Viterbi decoding sequence output by the Viterbi decoder 611, and performs correction when an error is detected.

Specifically, the post processor 612 calculates a square error in a difference between a sequence obtained by letting a Viterbi decoding sequence output from the Viterbi decoder 611 pass through a channel signal characteristic filter and the equalizer output sequence $y_k$, and determines an error position and an error pattern, which are considered to be most probable, to perform error correction.

The hard disk controller 620 has a high-performance decoding unit 621, instead of the high-performance decoding unit 124 included in the hard disk controller 120. The high-performance decoding unit 621 is a processing unit that performs Viterbi decoding by using the equalizer output sequence $y_k$ stored in the equalizer output sequence storage unit 113, and performs higher performance post processing. The high-performance decoding unit 621 is realized by software executed by the MPU.

Figure 7:
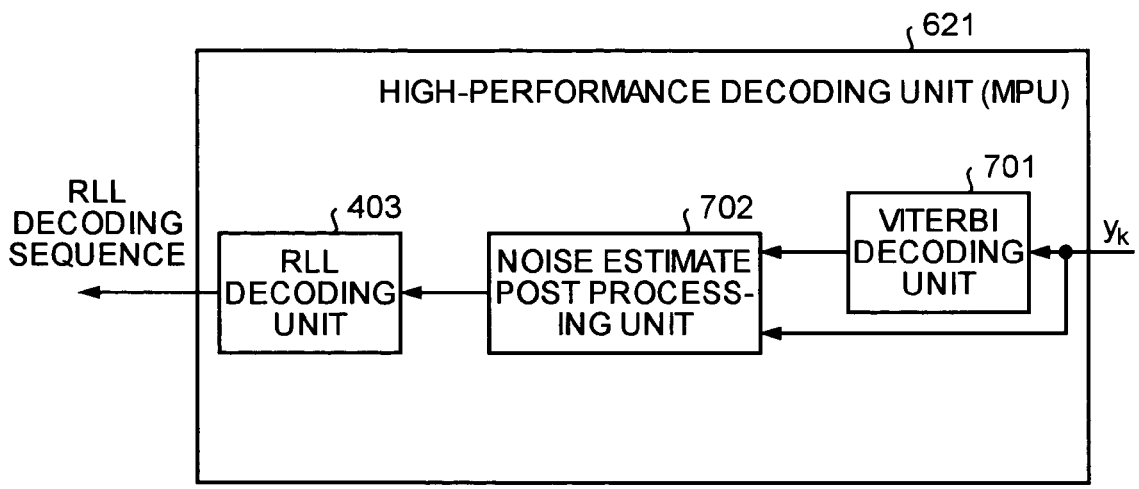
FIG. 7 is a block diagram for illustrating a software configuration of a high-performance decoding unit shown in FIG. 6.

FIG. 7 is a block diagram for illustrating a software configuration of the high-performance decoding unit 621. The high-performance decoding unit 621 has a Viterbi decoding unit 701, a noise estimate post processing unit 702, and an RLL decoding unit 403. The noise estimate post processing unit 702 constitutes the noise estimate post processing unit in the present invention.

The Viterbi decoding unit 701 is a processing unit that performs Viterbi decoding by using the equalizer output sequence $y_k$ transferred from the equalizer output sequence storage unit 113 to the transfer data storage unit 123.

The noise estimate post processing unit 702 is a processing unit that performs high-performance post processing as compared with the post processor 612. Specifically, the noise estimate post processing unit 702 calculates a square error in a difference between a sequence obtained by letting a Viterbi decoding sequence output from the Viterbi decoding unit 701 pass through a filter, in which not only the channel signal characteristic but also the channel noise characteristic are taken into consideration, and the equalizer output sequence $y_k$, and determines an error position and an error pattern, which are considered to be most probable, to perform error correction.

As described above, since the noise estimate post processing unit 702 filters the Viterbi decoding sequence, taking into consideration not only the channel signal characteristic but also the channel noise characteristic, high-performance Viterbi decoding can be performed.

In the second embodiment, when the ECC correction unit 121 cannot correct the detected error, the noise estimate post processing unit 702 performs error correction in the Viterbi decoding sequence, by using the filter in which not only the channel signal characteristic but also the channel noise characteristic are taken into consideration. As a result, high-performance maximum likelihood decoding can be performed without increasing the hardware quantity of the read channel 610.

Figure 8:
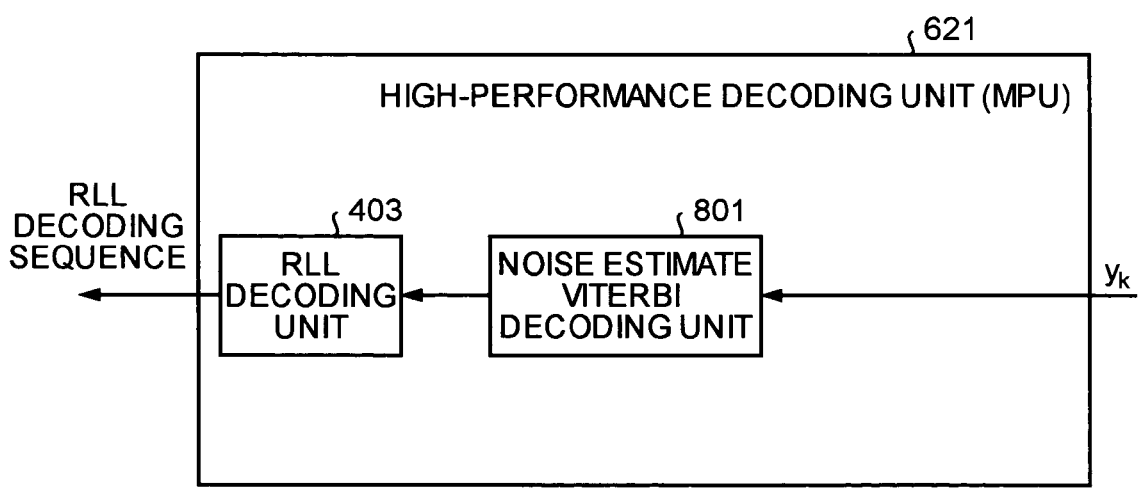
FIG. 8 is a block diagram for illustrating another software configuration of a high-performance decoding unit shown in FIG. 6.

FIG. 8 is a block diagram for illustrating another software configuration of the high-performance decoding unit 621. The high-performance decoding unit 621 has a noise estimate Viterbi decoding unit 801 and the RLL decoding unit 403.

The noise estimate Viterbi decoding unit 801 is a processing unit that Viterbi-decodes the equalizer output sequence $y_k$. However, the noise estimate Viterbi decoding unit 801 calculates the channel information $\Lambda_{nc}$ by using the following equation (2), taking it into consideration that the actual equalizer output sequence $y_k$ does not have the ideal integer value due to an equalization error or the like, and channel noise becomes colored noise having correlation.

$$\Lambda_{nc}(y_k | S_k) = -\ln\sigma(S_k) - \frac{\left[y_k - d(S_k) - \sum_{i=1}^{M} e_i(S_k)(y_{k+i} - d(S_{k-i}))\right]^2}{2\sigma^2(S_k)} \quad (2)$$

where $y_k$: equalizer output sequence $d(S_k)$: equalizer output value corresponding to state $S_k$ $\sigma^2(S_k)$: noise power value after equalization corresponding to state $S_k$ $e_i(S_k)$: correlation value between noises after equalization corresponding to state $S_k$ $S_k$: state assigned to a signal pattern.

As described above, even when the noise estimate Viterbi decoding unit 801 that performs Viterbi decoding, taking the channel signal characteristic and the channel noise characteristic into consideration, is used for the high-performance decoding unit 621, high-performance maximum likelihood decoding can be performed.

In the embodiments 1 and 2, examples in which maximum a posteriori decoding and maximum likelihood decoding are performed in the read channel have been explained. However, the present invention is not limited thereto, and is also applicable to an instance in which maximum a posteriori decoding and maximum likelihood decoding are not performed in the read channel.

According to the present invention, decoding performance can be improved without increasing the power consumption and data readout delay.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for reading a recording medium, comprising:
  a determining unit that determines whether an error detected by using an error correcting code is correctable with respect to a signal sequence read from the recording medium;
  a decoding unit that performs maximum a posteriori decoding of the signal sequence upon the determining unit determining that the error is not correctable;
  an internal code decoder that calculates a first reliability information and an external information; and
  an external code decoder that calculates, based on the external information, a second reliability information with respect to a maximum a posteriori decoding sequence to output the maximum a posteriori decoding sequence based on the second reliability information calculated, wherein
  the decoding unit performs maximum a posteriori decoding of the signal sequence by repetitively using the internal code decoder and the external code decoder until a repetition end condition is satisfied.

2. The apparatus according to claim 1, wherein
  the internal code decoder is a BCJR decoder, and
  the external code decoder is an LDPC decoder.

3. The apparatus according to claim 1, wherein
  the internal code decoder is a decision aided equalizer decoder, and
  the external code decoder is a turbo decoder.

4. The apparatus according to claim 1, further comprising:
  a syndrome generating unit the generates a syndrome based on a check matrix of the error correcting code and the signal sequence, wherein
  the determining unit determines whether the error is correctable by using the syndrome generated.

5. The apparatus according to claim 4, wherein the error correcting code is a Reed-Solomon code.

6. An apparatus for reading a recording medium, comprising:
  a determining unit that determines whether an error detected by using an error correcting code is correctable with respect to a signal sequence read from the recording medium;
  a decoding unit that performs maximum likelihood decoding of the signal sequence upon the determining unit determining that the error is not correctable, wherein the decoding unit includes
  a Viterbi decoding unit that outputs a Viterbi decoding sequence by performing maximum likelihood decoding based on Viterbi decoding of the signal sequence; and
  a noise estimate post processing unit that creates a filter passing sequence by filtering the Viterbi decoding sequence based on a channel signal characteristic and a channel noise characteristic, and that performs an error correction of the Viterbi decoding sequence by using the filter passing sequence and the signal sequence.

7. The apparatus according to claim 6, further comprising:
  a syndrome generating unit the generates a syndrome based on a check matrix of the error correcting code and the signal sequence, wherein
  the determining unit determines whether the error is correctable by using the syndrome generated.

8. The apparatus according to claim 7, wherein the error correcting code is a Reed-Solomon code.

9. A method for reading a recording, comprising:
  determining whether an error detected by using an error correcting code is correctable; and
  performing maximum a posteriori decoding of a signal sequence read from the recording medium upon determining that the error is not correctable; wherein
  the maximum a posteriori decoding of the signal sequence is performed by repetitively using an internal code decoder and an external code decoder until a repetition end condition is satisfied, wherein
  the internal code decoder calculates a first reliability information and an external information, and
  the external code decoder calculates, based on the external information, a second reliability information with respect to a maximum a posteriori decoding sequence to output the maximum a posteriori decoding sequence based on the second reliability information calculated.

10. The method according to claim 9, wherein
  the internal code decoder is a BCJR decoder, and
  the external code decoder is an LDPC decoder.

11. The method according to claim 9, wherein
  the internal code decoder is a decision aided equalizer decoder, and
  the external code decoder is a turbo decoder.

12. A method for reading a recording, comprising:
  determining whether an error detected by using an error correcting code is correctable; and performing maximum likelihood decoding of a signal sequence read from the recording medium upon determining that the error is not correctable; wherein the performing includes outputting a Viterbi decoding sequence by performing maximum likelihood decoding based on Viterbi decoding of the signal sequence;

creating a filter passing sequence by filtering the Viterbi decoding sequence based on a channel signal characteristic and a channel noise characteristic; and performing an error correction of the Viterbi decoding sequence by using the filter passing sequence and the signal sequence.

13. The method according to claim 9, further comprising:
generating a syndrome based on a check matrix of the error correcting code and the signal sequence, wherein
the determining determines whether the error is correctable by using the syndrome generated.

14. The method according to claim 13, wherein the error correcting code is a Reed-Solomon code.

15. The method according to claim 12, further comprising:
generating a syndrome based on a check matrix of the error correcting code and the signal sequence, wherein
the determining unit determines whether the error is correctable by using the syndrome generated.

16. The method according to claim 15, wherein the error correcting code is a Reed-Solomon code.

17. A hard disk controller used in an apparatus for reading a recording medium, comprising:
a determining unit that determines whether an error detected by using an error correcting code is correctable with respect to a signal sequence read from the recording medium;

a decoding unit that performs maximum likelihood decoding of the signal sequence, upon the determining unit determining that the error is not correctable;

a correcting unit that detects an error by using the error correcting code with respect to the signal sequence, and corrects the detected error; and a checking unit that checks whether the error correction by the correcting unit is correct; wherein the decoding unit includes a Viterbi decoding unit that outputs a Viterbi decoding sequence by performing maximum likelihood decoding based on Viterbi decoding of the signal sequence; and a noise estimate post processing unit that creates a filter passing sequence by filtering the Viterbi decoding sequence based on a channel signal characteristic and a channel noise characteristic, and that performs an error correction of the Viterbi decoding sequence by using the filter passing sequence and the signal sequence.

18. The hard disk controller according to claim 17, wherein the decoding unit includes
a noise estimate Viterbi decoding unit that performs a Viterbi decoding using channel information based on a channel signal characteristic and a channel noise characteristic, wherein
the decoding unit performs maximum likelihood decoding of the signal sequence by Viterbi decoding.

19. The hard disk controller according to claim 17, further comprising:
a syndrome generating unit the generates a syndrome based on a check matrix of the error correcting code and the signal sequence, wherein
the determining unit determines whether the error is correctable by using the syndrome generated.

* * * * *

UNITED STATES PATENT AND TRADEMARK OFFICE
CERTIFICATE OF CORRECTION

PATENT NO. : 7,434,136 B2 Page 1 of 1
APPLICATION NO. : 10/766969
DATED : October 7, 2008
INVENTOR(S) : Kazuhito Ichihara It is certified that error appears in the above-identified patent and that said Letters Patent is hereby corrected as shown below:

Col. 12, line 6, delete "unit the generates" and insert --unit generates--.

Col. 12, line 33, delete "unit the generates" and insert --unit generates--.

Col. 14, line 33, delete "unit the generates" and insert --unit generates--.

Signed and Sealed this

Twelfth Day of May, 2009

JOHN DOLL
*Acting Director of the United States Patent and Trademark Office*